(12) United States Patent
Shioga et al.

(10) Patent No.: US 8,203,198 B2
(45) Date of Patent: Jun. 19, 2012

(54) THIN FILM CAPACITOR DEVICE USED FOR A DECOUPLING CAPACITOR AND HAVING A RESISTOR INSIDE

(75) Inventors: Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 999 days.

(21) Appl. No.: 11/531,446

(22) Filed: Sep. 13, 2006

(65) Prior Publication Data

US 2007/0205486 A1 Sep. 6, 2007

(30) Foreign Application Priority Data

Mar. 1, 2006 (JP) ................................. 2006-054235

(51) Int. Cl.
*H01L 21/20* (2006.01)
(52) U.S. Cl. ........ 257/532; 257/536; 257/537; 257/758; 257/358; 257/759; 257/E21.009; 257/E21.597; 257/E23.079; 438/396
(58) Field of Classification Search .................. 257/532, 257/536, 537, 758, 358, 759, E21.009, E21.597, 257/E23.079; 438/396
See application file for complete search history.

(56) References Cited

U.S. PATENT DOCUMENTS

| | | | |
|---|---|---|---|
| 5,455,064 A | 10/1995 | Chou et al. | |
| 5,874,770 A * | 2/1999 | Saia et al. | 257/536 |
| 5,935,642 A | 8/1999 | Suga | |
| 6,407,929 B1 * | 6/2002 | Hale et al. | 361/763 |
| 6,853,051 B2 * | 2/2005 | Shioga et al. | 257/532 |
| 2002/0177326 A1 * | 11/2002 | Klee et al. | 438/758 |
| 2004/0130849 A1 * | 7/2004 | Kurihara et al. | 361/311 |

FOREIGN PATENT DOCUMENTS

| | | |
|---|---|---|
| JP | 4-211191 A | 8/1992 |
| JP | 7-176453 A | 7/1995 |
| JP | 9-148529 A | 6/1997 |
| JP | 2000-286111 A | 10/2000 |
| JP | 2001-35990 A | 2/2001 |
| JP | 2001-68583 A | 3/2001 |
| JP | 2004-146445 A | 5/2004 |
| JP | 2004-214589 A | 7/2004 |
| JP | 2004-241439 A | 8/2004 |
| JP | 2004-523924 A | 8/2004 |
| JP | 2004-273825 A | 9/2004 |
| WO | 02/075780 A2 | 9/2002 |

OTHER PUBLICATIONS

Japanese Office Action dated Mar. 29, 2011, issued in corresponding Japanese Patent Application No. 2006-054235.
Japanese Office Action dated Sep. 14, 2010, issued in corresponding Japanese Patent Application No. 2006-054235.

* cited by examiner

*Primary Examiner* — Junghwa M Im
(74) *Attorney, Agent, or Firm* — Westerman, Hattori, Daniels & Adrian, LLP

(57) ABSTRACT

A thin film capacitor device of the present invention has a thin film capacitor having two electrodes and a dielectric layer provided therebetween and external terminals electrically connected to the electrodes. In addition, the thin film capacitor device also has resistor layers which are provided between the external terminals and the electrodes and adjacent thereto, and which are formed of a material have a higher resistivity than that of the adjacent electrodes.

8 Claims, 15 Drawing Sheets

THIN FILM CAPACITOR DEVICE USED FOR A DECOUPLING CAPACITOR AND HAVING A RESISTOR INSIDE

BACKGROUND OF THE INVENTION

1. Field of the Invention

The present invention relates to a thin film capacitor device including a thin film capacitor, an interposer, a semiconductor device, and manufacturing methods thereof, and more particularly, relates to a thin film capacitor device having a small adverse influence on another device or the like even when a thin film capacitor is short-circuited due to damage done thereto, an interposer, a semiconductor device, and manufacturing methods thereof.

2. Description of the Related Art

In recent years, in order to prevent malfunction of circuits due to variation in power source voltage, high frequency noises, and the like, a decoupling capacitor has been used.

The decoupling capacitor is generally disposed on a circuit substrate and in the vicinity of a device such as a semiconductor integrated circuit. In addition, it is necessary that the decoupling capacitor be connected to the device with a low inductance.

In order to realize the requirement described above, a thin film capacitor has drawn attention which is formed by a micro-fabrication technique for forming thin films. For example, in a thin film capacitor device including this thin film capacitor, when external terminals are formed of many solder bumps (protruding electrodes) provided at short intervals, and when solder bumps for different electrodes are alternately disposed, the thin film capacitor device can be connected to a semiconductor integrated circuit device with a small inductance in a high frequency region.

In addition, when a thin film capacitor device is mounted onto a circuit substrate, mounting by flip chip bonding using solder bumps can be performed, and hence higher reliability and reduction in cost can also be obtained.

As described above, in recent years, a thin film capacitor device has started to be used as a decoupling capacitor, and in this case, the thin film capacitor device is mounted on a circuit substrate and is disposed in the vicinity of a semiconductor integrated circuit device.

However, in this mounting structure described above, wires provided between the thin film capacitor device and the semiconductor integrated circuit device may cause the increase in inductance. In addition, the increase in inductance caused by drawing the wires may degrade high frequency properties of the decoupling capacitor in some cases.

Accordingly, in order to reduce the inductance, a proposal has been made in which a thin film capacitor is disposed right under a semiconductor integrated circuit device (inside a circuit substrate) to minimize the lengths of wires drawn from a power source line and a ground line of the semiconductor integrated circuit device to the thin film capacitor (for example, see Japanese Unexamined Patent Application Publication No. 4-211191).

In addition, as one application of the above structure, the structure has also been proposed in which an interposer embedded thin film capacitors is provided between a package substrate and a semiconductor integrated circuit device mounted thereon (for example, see Japanese Unexamined Patent Application Publication Nos. 7-176453, 2001-68583, and 2001-35990).

However, since a thin film forming a dielectric layer of the thin film capacitor has a very small thickness, such as approximately 100 nm, the dielectric breakdown is liable to occur, and since a dielectric layer having a perovskite crystal structure causes lattice defects and oxygen defects inside the layer (thin film) under specific conditions, the increase in leak current may occur in some cases. In addition, electron behavior at an electrode interface may also cause the increase in leak current in some cases.

When the problem of the dielectric breakdown as described above occurs, adverse phenomena may occur such that a device connected to the thin film capacitor device malfunctions or is damaged. As a result, by the phenomena described above, the reliability of an entire semiconductor package may be degraded in some cases.

In particular, since the decoupling capacitor is provided between a power source line and a ground line, it is believed that damage caused by the dielectric breakdown of the decoupling capacitor may generate a serious and large influence.

SUMMARY OF THE INVENTION

Accordingly, the present invention was made in consideration of the problems described above, and an object of the present invention is to provide a highly reliable thin film capacitor device, interposer, semiconductor device, and manufacturing methods thereof, the highly reliable thin film capacitor device causing no adverse influence on another device or the like connected thereto even when a problem such as the dielectric breakdown occurs.

The inventors of the present invention discovered that when a resistor is provided in series between an external terminal and a thin film capacitor, the problems described above can be solved, and as a result, the present invention was made.

When this resistor is made of a material having a higher resistivity than that of a material forming an electrode of the thin film capacitor and is provided adjacent to the electrode, easy and simple mountability can be realized, and in addition, the problems can be solved.

In accordance with one aspect of the present invention, there is provided a thin film capacitor device which comprises a thin film capacitor having two electrodes and a dielectric layer provided therebetween. The thin film capacitor has at least one resistor layer formed on one of the electrodes, the resistor layer having a higher resistivity than the one electrode. The thin film capacitor has pair of external terminals, one of the external terminals being formed on the resistor layer.

By the structure described above, even when a problem such as dielectric breakdown occurs, current is controlled by the resistor layer (resistor) interposed in series, and hence malfunction of another semiconductor device can be prevented. In addition, the resistor layer can be easily formed in a step similar to that for forming a protective film and the like.

As described above, according to the present invention, a highly reliable thin film capacitor device, interposer, semiconductor device, and manufacturing methods thereof can be provided, the highly reliable thin film capacitor device causing no adverse influence on another device connected thereto even when a problem such as dielectric breakdown occurs in a thin film capacitor.

In addition, a protective resistor, a protective circuit, or the like which has been mounted on a circuit substrate in the past may not be required. In particular, in a package such as an interposer incorporating thin film capacitors in which a protective circuit against dielectric breakdown thereof is difficult to be formed, the present invention is significantly effective.

DETAILED DESCRIPTION OF THE INVENTION

Hereinafter, as best mode for carrying out the present invention, several examples will be described.

Example 1

Figure 1:
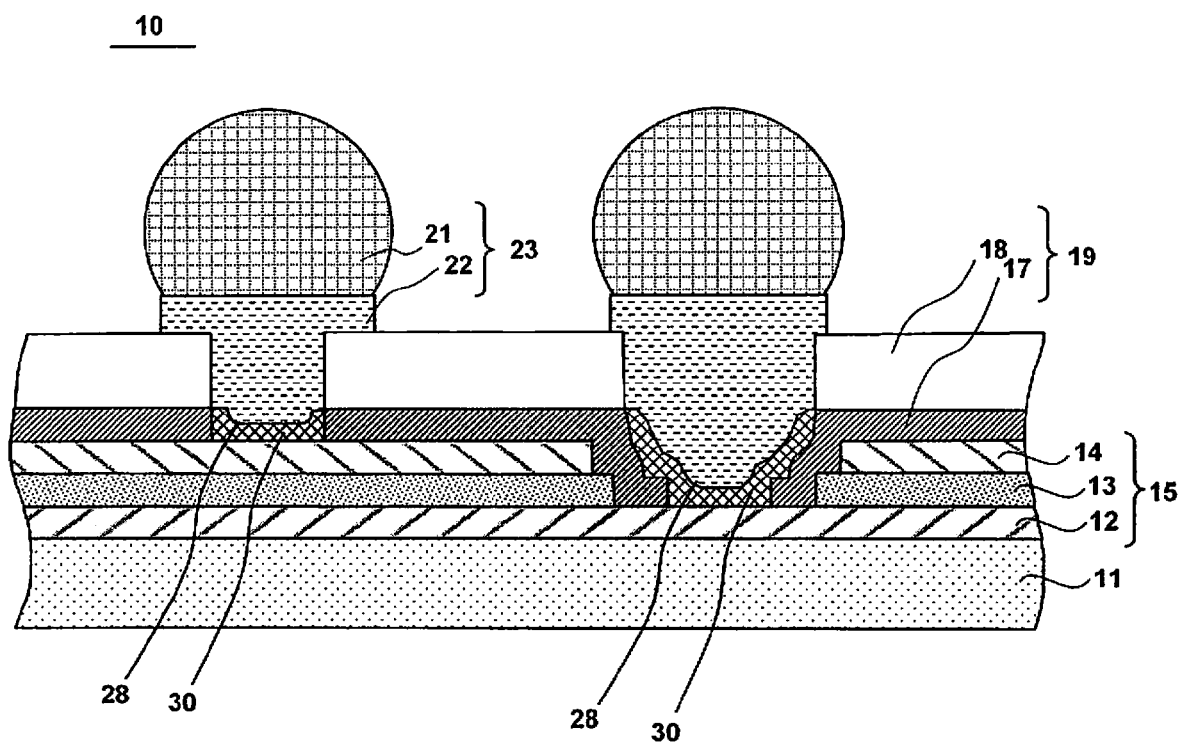
FIG. 1 is a schematic cross-sectional view of one example of a thin film capacitor device of Example 1 according to the present invention.

Hereinafter, the examples of the present invention will be described in detail with reference to figures. FIG. 1 is a schematic cross-sectional view of one example of a thin film capacitor device of Example 1 according to the present invention.

As shown in FIG. 1, a thin film capacitor device 10 of Example 1 is formed of a support substrate 11, a thin film capacitor 15, an insulating protective film 19 covering the thin film capacitor 15, external terminals 23 to be connected to an external device, and the like.

—Thin Film Capacitor—

As shown in FIG. 1, the thin film capacitor 15 is formed of three layers, that is, a lower electrode 12, a dielectric layer 13, and an upper electrode 14, and in addition, the lower electrode 12, the dielectric layer 13, and the upper electrode 14 are provided on the support substrate 11 in that order.

In addition, as shown in the figure, for example, the lower electrode 12 of the thin film capacitor 15 is a common electrode connected to the external terminals 23.

—External Terminal—

As shown in the figure, the external terminal 23 is formed of a solder bump 21 located at a top end portion of the terminal and an under-bump metal (UBM) 22 located at a side opposite to the top end portion. The UBM 22 is a barrier metal disposed under the bump 21 and prevents a material forming the bump 21 from diffusing in the direction toward the electrode side.

The bump 21 is formed, in general, of solder or gold. As a material for the UBM 22, for example, chromium (Cr), titanium (Ti), and nickel (Ni) may be mentioned.

—Protective Film—

The protective film 19 has insulating properties and covers the thin film capacitor 15. In addition, as shown in the figure, for example, the protective film 19 is formed of an organic resin film 18 and a moisture-resistant protective film 17 covered therewith, the moisture-resistant protective film 17 directly covering the thin film capacitor 15 and functioning as a barrier to prevent water or hydrogen ions from entering the thin film capacitor 15. In addition, as shown in the figure, for example, the moisture-resistant protective film 17 is preferably formed on the side surfaces of the thin film capacitor 15 so as to entirely cover the thin film capacitor 15.

—Resistor Layer—

Between the electrode (the upper electrode 14 or the lower electrode 12) of the thin film capacitor 15 and the external terminal 23, a resistor layer 30 is provided in order to avoid a case in which a large current is allowed to flow when the dielectric layer 13 is destroyed by dielectric breakdown.

As shown in the figure, for example, this resistor layer 30 is disposed adjacent to the corresponding lower electrode 12 or upper electrode 14 and is formed of a material having a higher resistivity than that of the above lower electrode 12 or upper electrode 14.

Furthermore, as a material used for the resistor layer 30, for example, a transition metal nitride or oxide may be mentioned, and in particular, an alloy containing at least two elements selected from the group consisting of nickel (Ni), chromium (Cr), aluminum (Al), silicon (Si), and iron (Fe) is preferably used.

In addition, the resistivity of a material used for the resistor layer 30 is preferably 100 $\Omega \cdot cm$ or more. Since having the resistivity described above, the resistor layer 30 has a resistance of approximately 0.1 k$\Omega$/□ or more per one external terminal, and when the dielectric layer 13 is destroyed by dielectric breakdown, a current flowing between the electrodes of the thin film capacitor can be suppressed to approximately several tens of milliamperes. As a result, even when a trouble such as short-circuiting as described above occurs, another device or apparatus electrically connected to the thin film capacitor device 10 can be protected from being destroyed.

Furthermore, a part of the surface of the resistor layer 30 is exposed through an opening formed in the protective film 19. In addition, the exposed part (exposed surface 28) described above is in contact with the external terminal 23 so as to be electrically connected thereto.

As described above, since the moisture-resistant protective film 17 is provided between the organic resin film 18 and the thin film capacitor 15, that is, since the organic resin film 18 is formed so as not to be in direct contact with the thin film capacitor 15, the degradation in functions of the thin film capacitor 15 is suppressed which is caused when hydrogen ions generated from the organic resin film 18 reach the dielectric layer 13 of the thin film capacitor 15.

Furthermore, when a material for the moisture-resistant protective film 17 and a material for the dielectric layer 13 of the thin film capacitor 15 are formed from the same elements, a mechanical and thermal mismatch can be reduced. In this case, as the materials for the moisture-resistant protective film 17 and the dielectric layer 13, an amorphous metal oxide may be preferable.

<Method for Manufacturing Thin Film Capacitor Device>

Next, one example of a manufacturing method of a thin film capacitor device of Example 1 will be described with reference to figures. FIGS. 2A to 4C are schematic cross-sectional views of one example of a method for manufacturing the thin film capacitor device according to Example 1.

(i) Thin Film Capacitor Forming Step

Figure 2A:
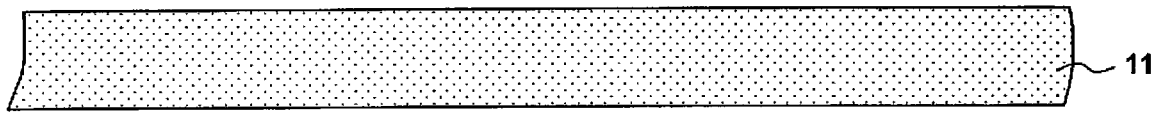
FIGS. 2A to 2E are schematic cross-sectional views (part 1) of one example of a method for manufacturing a thin film capacitor device.
Figure 2B:
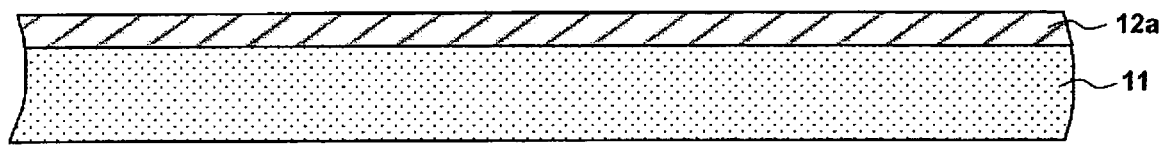

First, as shown in FIGS. 2A and 2B, on the support substrate 11, a lower electrode forming layer 12a is formed for forming the lower electrode.

For example, the support substrate 11 is a silicon wafer having Si thermal oxide layer. The lower electrode forming layer 12a is formed on the silicon wafer by a sputtering method. In particular, for example, the formation of the lower electrode forming layer 12a is performed by sequentially forming a titanium oxide ($TiO_2$) film of 20 nm thick and a platinum (Pt) film of 100 nm thick. In the step described above, the titanium oxide film functions as an adhesive layer for adhering between the $SiO_2$ and the platinum.

The sputtering condition for forming the titanium oxide film is set, for example, so that the substrate temperature is 500° C., the RF power is 200 W, the gas pressure is 0.1 Pa, and the $Ar/O_2$ ratio is 5/1. In addition, for forming the platinum film by sputtering, for example, the condition is set so that the substrate temperature is 400° C., the RF power is 100 W, and the gas pressure is 0.1 Pa.

Figure 2C:
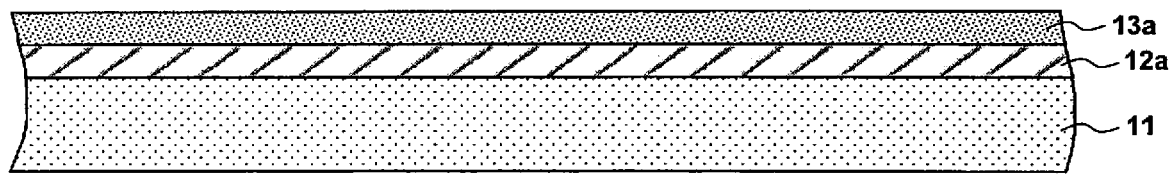

Next, as shown in FIG. 2C, on the lower electrode forming layer 12a, a dielectric layer forming layer 13a for forming the dielectric layer is formed.

For the dielectric layer forming layer 13a, an oxide, $Ba_xSr_{1-x}TiO_3$ (hereinafter referred to as "BST"), formed of barium (Ba), strontium (Sr), and titanium (Ti) is used. Since having a relatively large relative dielectric constant, BST is an effective material for forming a compact capacitor having a large capacitance. For example, BST in the form of bulk material has a relative dielectric constant of 1,500.

In this example, the dielectric layer forming layer 13a is formed by a sputtering method as is the case of the lower electrode forming layer 12a. The sputtering condition for forming the BST film is set so that the substrate temperature is 600° C., the RF power is 800 W, the gas pressure is 0.5 Pa, and the $Ar/O_2$ ratio is 4/1. After the film formation performed under the condition as described above, for example, a BST film is formed having a film thickness of 100 nm, a relative dielectric constant of 400, and a dielectric loss of 1% or less.

Figure 2D:
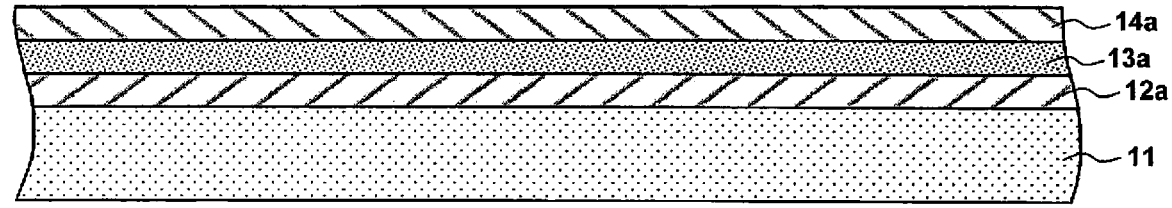

Next, as shown in FIG. 2D, on the dielectric layer forming layer 13a, an upper electrode forming layer 14a is formed using gold (Au) or the like. The sputtering condition forming the upper electrode forming layer 14a is set equivalent to that for the lower electrode forming layer 12a, and by the film formation performed under this condition, for example, the upper electrode forming layer 14a is formed so as to have a thickness of 100 nm.

(ii) Lower Electrode Extraction Step

Figure 2E:
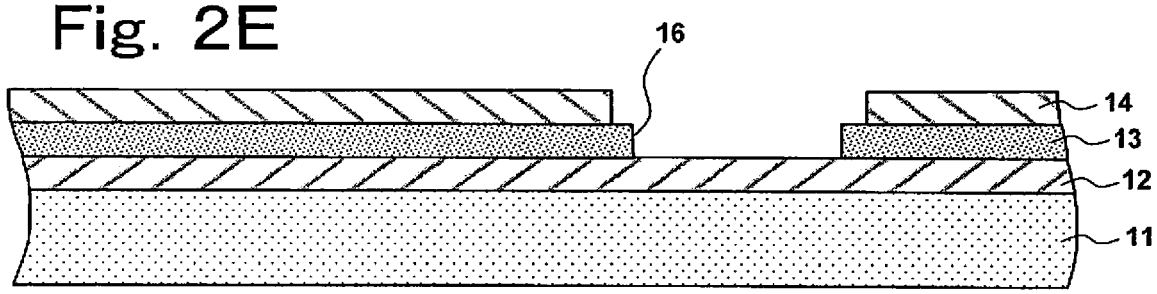

Next, as shown in FIG. 2E, an electrode extraction hole 16 for extracting the lower electrode is formed. The electrode extraction hole 16 is formed by selectively removing parts of the upper electrode forming layer 14a and the dielectric layer forming layer 13a, which are located at a position at which the external terminal 23 is to be provided.

In particular, on the upper electrode forming layer 14a, a resist mask (not shown) is formed by a photolithographic method. Subsequently, by an ion milling method, the upper electrode forming layer 14a and the dielectric layer forming layer 13a are sequentially dry-etched. As the ion milling method, for example, an argon ion milling method using argon (Ar) may be used. In addition, whenever necessary, a predetermined position of the lower electrode forming layer 12a may be selectively etched. In the steps described above, the upper electrode 14, the dielectric layer 13, and the lower electrode 12 are formed.

(iii) Moisture-Resistant Protective Film Forming Step

Figure 3A:
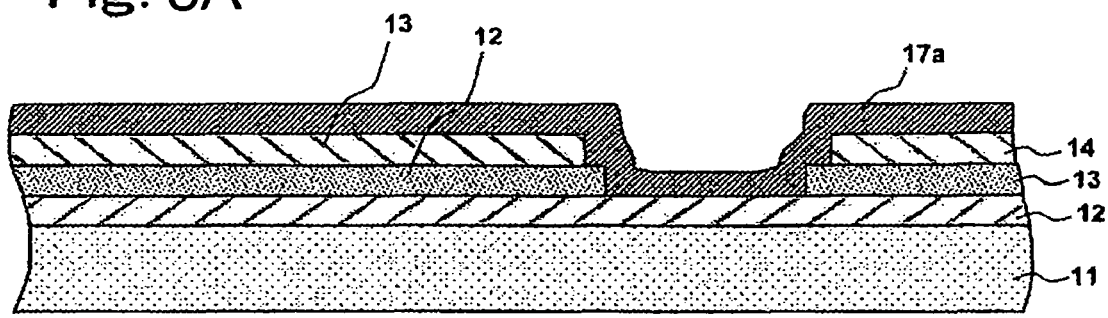
FIGS. 3A to 3C are schematic cross-sectional views (part 2) of one example of a method for manufacturing a thin film capacitor device.
Figure 3B:
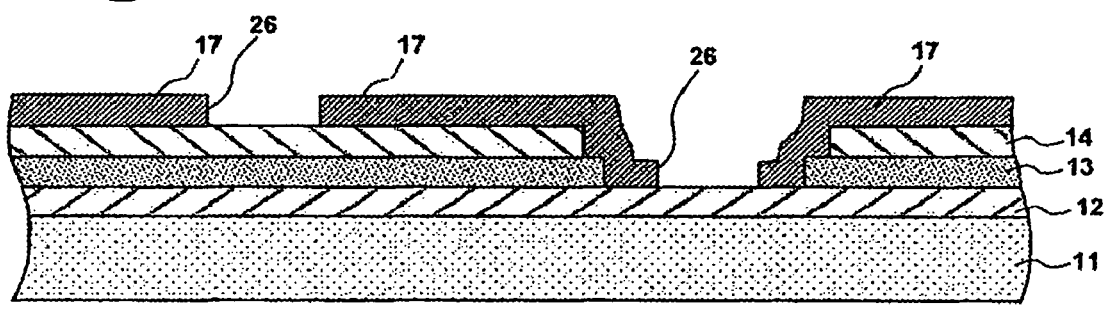

Next, as shown in FIGS. 3A and 3B, the moisture-resistant protective film 17 directly covering the thin film capacitor 15 is formed.

First, as shown in FIG. 3A, a moisture-resistant protective film forming layer 17a is formed by a sputtering method. The sputtering is performed, for example, at a substrate temperature of 80° C., an RF power of 500 W, a gas pressure of 0.1 Pa, and an $Ar/O_2$ ratio of 10/1. By sputtering performed under the condition described above, as the moisture-resistant protective film forming layer 17a, an aluminum oxide ($Al_2O_3$) film having a thickness of 100 nm is formed.

Subsequently, as shown in FIG. 3B, parts of the moisture-resistant protective film forming layer 17a thus formed are removed at which the external terminals 23 are to be provided. In particular, by a photolithographic method, a resist mask (not shown) is formed, and parts thereof corresponding to the external terminals 23 are etched away by an ion milling method. By the steps as described above, at the areas corresponding to the external terminals 23, the surface of the upper electrode 14 and that of the lower electrode 12 are exposed, that is, opening portions 26 are formed. As a result, the moisture-resistant protective film 17 is formed.

(iv) Resistor Layer Forming Step

Next, as shown in FIGS. 3C to 4A, the resistor layers 30 are formed.

The resistor layers 30 are formed by forming an alloy thin film (resistor layer forming layer 30a) made of a Ni—Cr—Si alloy by a sputtering method, followed by removal of unnecessary parts of the alloy thin film thus formed by etching.

Figure 3C:
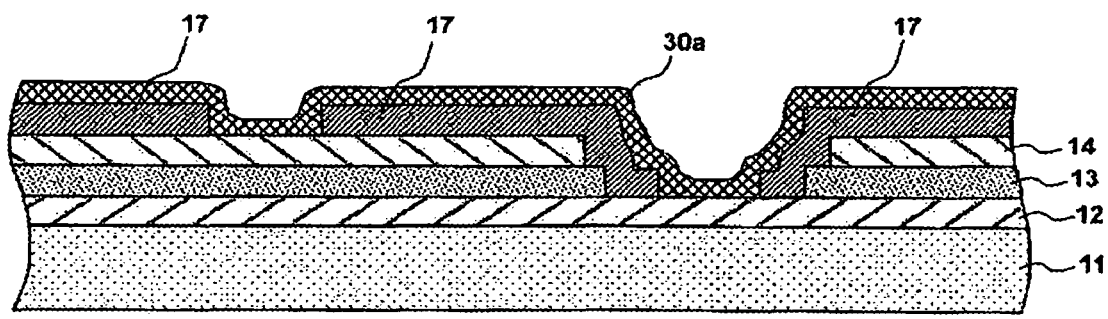

The sputtering for forming the above alloy thin film is performed, for example, at a substrate temperature of 60° C., an RF power of 1 KW, and an Ar gas pressure of 1.5 Pa. By the film formation performed under the above condition, for example, a Ni—Cr—Si alloy thin film having a thickness of 20 mm is formed (FIG. 3C).

Figure 4A:
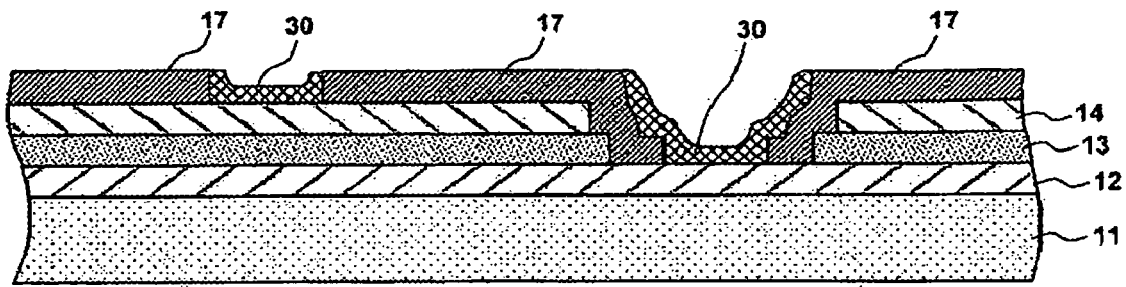
FIGS. 4A to 4C are schematic cross-sectional views (part 3) of one example of a method for manufacturing a thin film capacitor device.

Subsequently, by an ion milling method, parts of the above alloy thin film located at positions other than the recesses which are formed in the step shown in FIG. 3B and which correspond to the opening portions 26 are etched away (FIG. 4A). By the steps as described above, the resistor layers 30 are formed.

(v) Organic Resin Film and External Terminal Forming Step

Figure 4B:
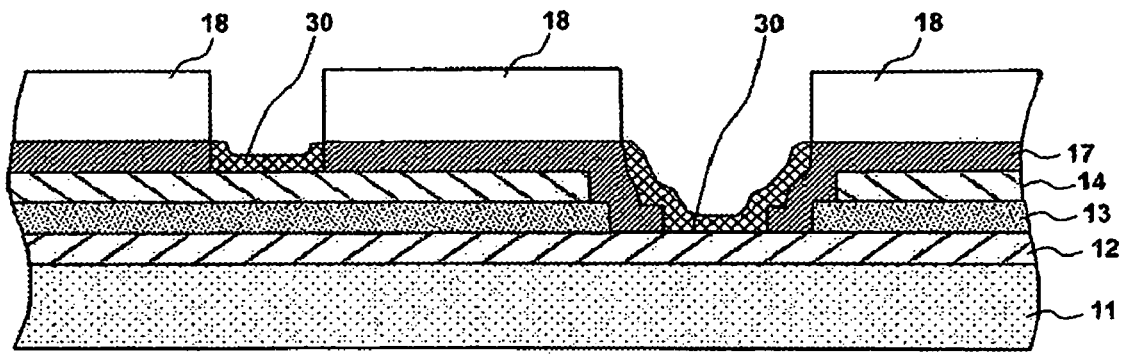
Figure 4C:
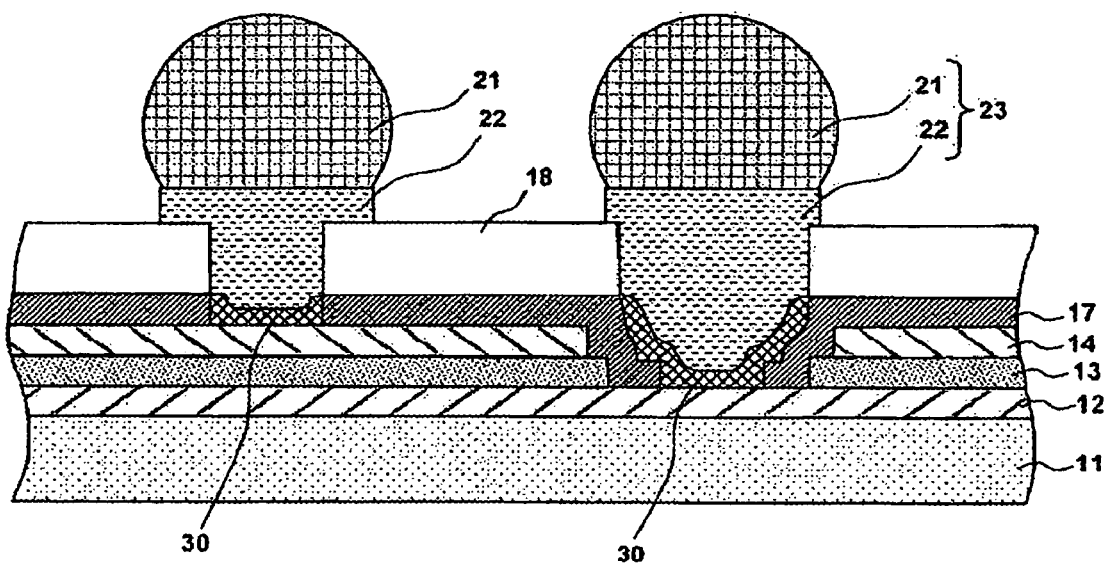

Next, as shown in FIGS. 4B and 4C, the organic resin film 18 and the external terminals 23 are formed.

First, the organic resin film 18 is formed by a spin coating method. After a photosensitive polyimide varnish is applied, spin coating is performed, for example, at 3,000 rpm for 30 seconds, so that a photosensitive polyimide film having a thickness of 6 µm is formed.

Next, pre-baking is performed at 60° C. for 10 minutes. Subsequently, by exposure and development, unnecessary parts are removed, followed by post-baking at 375° C. for 2 hours, so that a polyimide film having a thickness of 4 µm is formed (FIG. 4B). In this step, the diameter of the opening formed in the organic resin film 18 is 50 µm.

Subsequently, the external terminals 23 are formed. First, after the UBMs 22 are formed at positions corresponding to the respective external terminals, the bumps 21 are formed on the UBMs 22 (FIG. 4C).

By the manufacturing steps described above, the thin film capacitor device 10 shown in FIG. 1 is formed.

Example 2

In this example, in the thin film capacitor forming step of Example 1, the lower electrode forming layer 12a is formed by a sol-gel method, and the dielectric layer forming layer 13a is formed by a spin coating method. Hereinafter, the description which is the same as that of Examples 1 will be omitted.

(i) Thin Film Capacitor Forming Step

As shown in FIGS. 2A and 2B, on the support substrate 11, that is, the silicon wafer, the lower electrode forming layer 12a for forming the lower electrode is formed.

The formation of the lower electrode forming layer 12a is performed by a sol-gel method. In particular, for example, the lower electrode forming layer 12a is formed by sequentially forming a titanium oxide ($TiO_2$) layer having a thickness of 20 nm and a platinum (Pt) layer having a thickness of 100 nm. In this step, as a material for the lower electrode forming layer 12a, iridium (Ir) may also be used.

Next, as shown in FIG. 2C, the dielectric layer forming layer 13a is formed. The dielectric layer forming layer 13a is formed using a starting material solution containing an alkoxide by a spin coating method. The spin coating method is performed at 2,000 rpm for 30 seconds. By one spin coating step, for example, a film having a thickness of approximately 100 nm is obtained.

After a film having a predetermined thickness is formed from the starting material solution containing an alkoxide by spin coating performed under the condition as described above, pre-heating (400° C./10 minutes) is performed. Then, after a predetermined process is performed, post-heating (700° C./10 minutes) is performed, so that BST is crystallized. By the steps described above, as the dielectric layer forming layer 13a, a BST thin film is formed having a thickness of 100 nm, a dielectric constant of 300, and a dielectric loss of 2% or less.

Furthermore, on the BST thin film thus formed, the upper electrode forming layer 14a is formed by a sputtering method (at a substrate temperature of 400° C.). The upper electrode forming layer 14a is formed of iridium oxide ($IrO_2$) and has, for example, a thickness of 100 nm.

Next, a "lower electrode extraction step (ii)" and a "moisture-resistant protective film forming step (iii)" are performed in a manner similar to that in Example 1.

In addition, in the moisture-resistant protective film forming step of this example, as a material for the moisture-resistant protective film forming layer 17a, silicon nitride ($Si_3N_4$) is used. By a sputtering method, silicon nitride is deposited to have a thickness of 150 nm. In this step, the sputtering is performed, for example, at a substrate temperature of 200° C., an RF power of 500 W, an Ar gas pressure of 0.1 Pa, and an $Ar/N_2$ ratio of 5/1.

(iv) Resistor Layer Forming Step

Next, as shown in FIGS. 3C to 4A, the resistor layers 30 are formed. The resistor layers 30 are formed by forming an alloy thin film made of Fe—Cr by a sputtering method, followed by removal of unnecessary parts of the alloy thin film thus formed by etching.

The sputtering for forming the above alloy thin film is performed, for example, at a substrate temperature of 60° C., an RF power of 1 KW, and an Ar gas pressure of 1.0 Pa. By the film formation performed under the above condition, for example, a Fe—Cr alloy thin film having a thickness of 30 nm is formed (FIG. 3C).

Subsequently, by an ion milling method, parts of the above Fe—Cr alloy thin film located at positions other than those in opening portions corresponding to the exposed surfaces which are formed in the step shown in FIG. 3B are etched away (FIG. 4A).

Next, an "organic resin film and external terminal forming step (v)" is performed in a manner similar to that in Example 1. In the organic resin film forming step of this example, the diameter of the opening formed in a polyimide film is, for example, 40 µm.

By the manufacturing steps described above, the thin film capacitor device 10 shown in FIG. 1 is formed.

Example 3

In this example, as the moisture-resistant protective film 17 of Example 1, the same amorphous BST material as that for the dielectric material is used. In particular, as the moisture-resistant protective film 17, an amorphous BST thin film having a thickness of 150 nm is formed by a sputtering method.

As the film formation condition, the substrate temperature, RF power, gas pressure, and $Ar/O_2$ ratio are set 80° C., 800 W, 0.2 Pa, and 8/1, respectively. By the film formation performed at a low temperature as described above, the BST is not crystallized and is placed in an amorphous state.

As described above, since the same BST (elements) as that for the dielectric material of the thin film capacitor is used, advantages can be obtained such that the adhesion between the dielectric layer 13 and the moisture-resistant protective film 17 is improved and such that mechanical stress is not likely to be generated because of the same coefficient of linear thermal expansion.

Example 4

In this example, as a resin material for the organic resin film 18 of Example 1, an epoxy resin is used.

After the thin film capacitor 15 is formed, in the step shown in FIG. 4B, an epoxy resin film is formed by a spin coating method. In particular, on the moisture-resistant protective film 17 (inorganic reduction resistant protective film), an epoxy varnish is spin-coated at 2,000 rpm for 30 seconds. Next, after pre-baking at 60° C. and exposure/development, post-baking is performed at 300° C., so that an epoxy resin film having a thickness of 5 µm is obtained. Subsequently, by the steps equivalent to those in Example 1, the thin film capacitor device 10 is formed.

Example 5

In this example, as the dielectric material used in Example 1, a composite oxide having a high dielectric constant is used.

In particular, as the dielectric layer 13 of the thin film capacitor 15, a film made of Pb(Zr, Ti)O$_3$, a composite oxide, is formed by a sputtering method.

The sputtering is performed for 60 minutes at a substrate temperature of 400° C., a gas pressure of 0.5 Pa, an Ar/O$_2$ ratio of 9/1 and an application voltage of 120 W, so that a dielectric film having a thickness of 100 nm and a dielectric constant of 200 is formed. Subsequently, by the steps similar to those in Example 1, the thin film capacitor device 10 is formed.

Example 6

In this example, an interposer is formed which embeds thin film capacitors and resistor layers, which are similar to those in Example 1.

Figure 5:
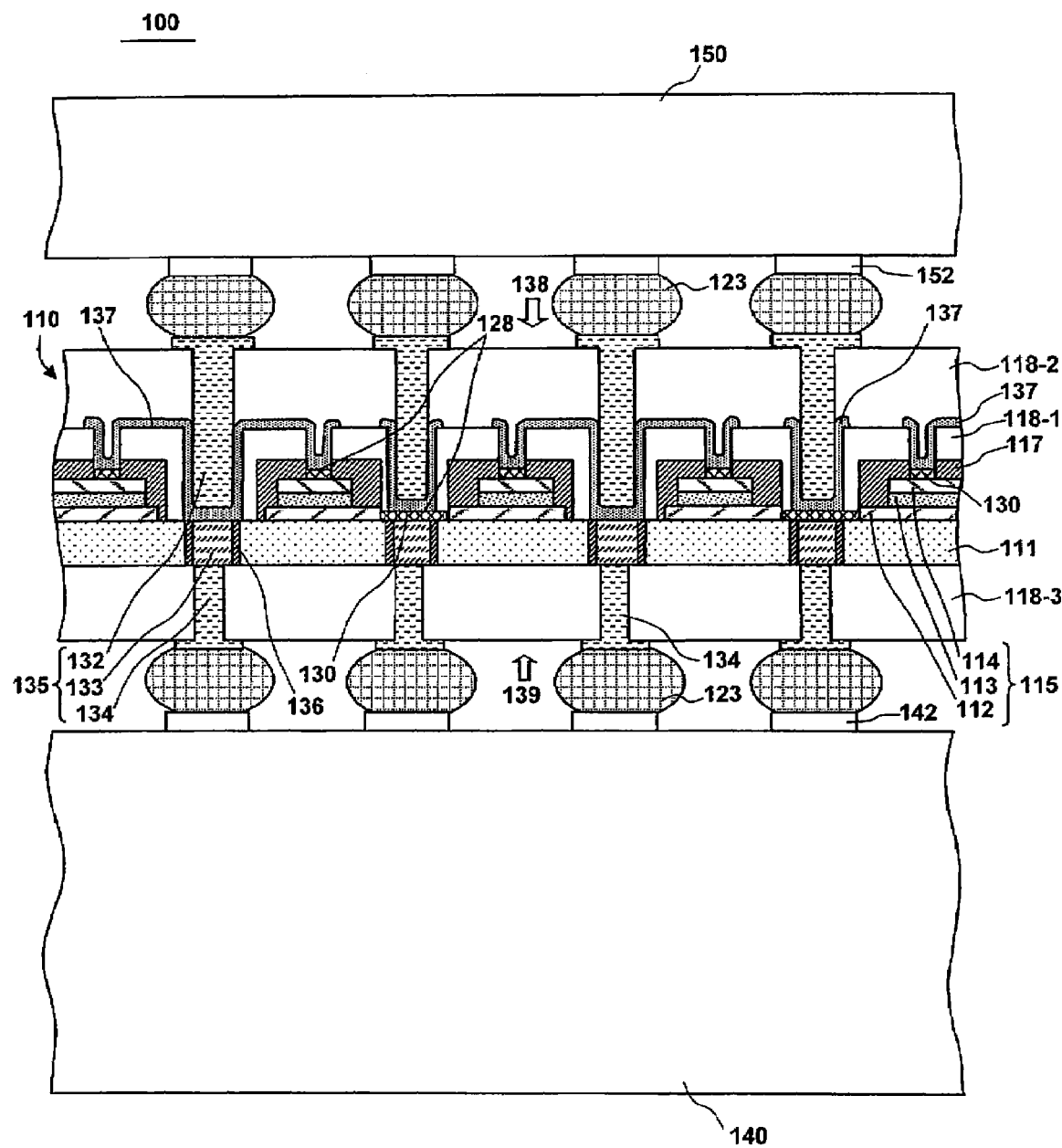
FIG. 5 is a schematic cross-sectional view of one example of an interposer of Example 6 according to the present invention.
Figure 6A:
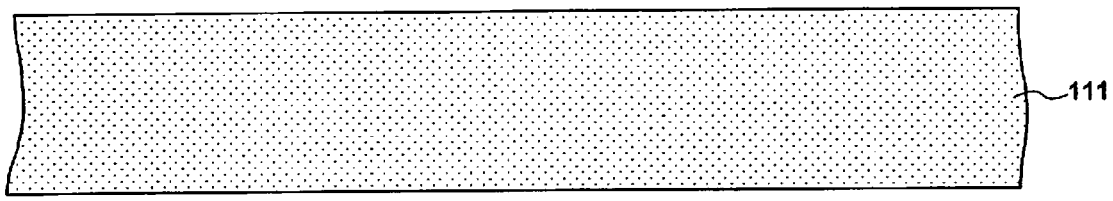
FIGS. 6A to 6D are schematic cross-sectional views (part 1) of one example of a method for manufacturing an interposer of Example 6 according to the present invention.
Figure 6B:
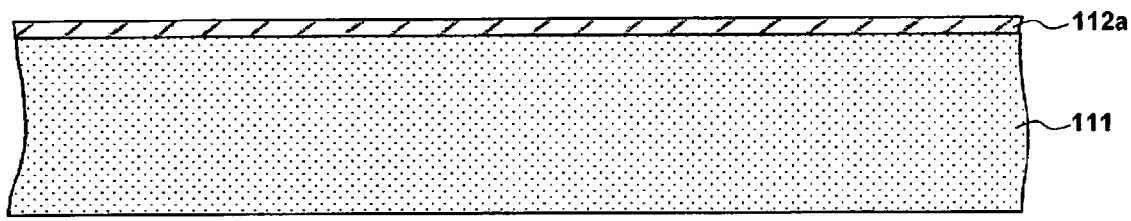
Figure 6C:
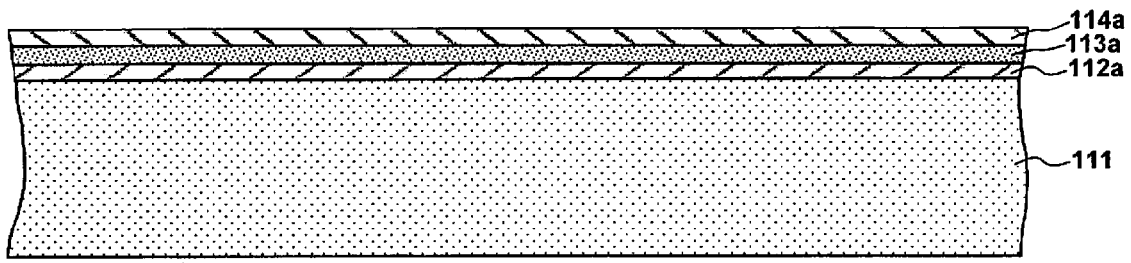
Figure 6D:
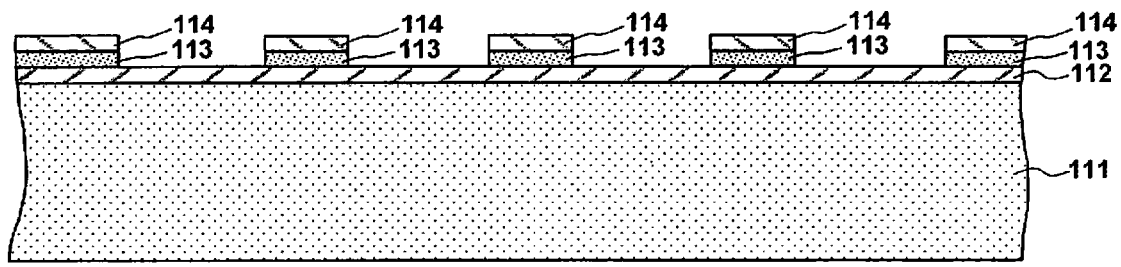

FIG. 5 is a schematic cross-sectional view of one example of an interposer of Example 6 according to the present invention. An interposer 110 of this example has the following structure.

—External Terminal—

In the interposer 110, on a first primary surface 138 facing a semiconductor integrated circuit 150 and a second primary surface 139 (surface opposite to the first primary surface 138), external terminals 123 are provided for electrical connection with an external device, apparatus or the like. In this example, the second primary surface 139 faces a circuit substrate 140.

—Through Via—

Furthermore, between external terminals (first terminals) provided on the first primary surface 138 and respective external terminals (second terminals) provided on the second primary surface 139, through vias 135 are provide for electrical connection therebetween.

—Thin Film Capacitor—

In a manner similar to that in Example 1, thin film capacitors 115 are each provided on a support substrate 111 and are each formed of a lower electrode 112, a dielectric layer 113, and an upper electrode 114 in that order from the bottom in the figure.

—Resistor Layer—

Between the upper electrode 114 and the through via 135 or between the lower electrode 112 and the through via 135, a resistor layer 130 is provided having a function similar to that of the resistor layer 30 of Example 1. The resistor layer 130 is disposed adjacent to the corresponding upper electrode 114 or lower electrode 112, and a material for the resistor layer 130 has a larger resistivity than that of the adjacent upper electrode 114 or lower electrode 112.

Furthermore, the surface of the resistor layer 130 is partly exposed through an opening formed in a protective film 119. In addition, the exposed part (through an opening portion 126) is directly connected to the through via 135 or a lead wire 137 extended therefrom.

<Manufacturing Method of Interposer>

Next, one example of a method for manufacturing an interposer of Example 6 will be described with reference to figures. FIGS. 6A to 10C are schematic cross-sectional views of one example of a manufacturing method of the interposer according to Example 6.

(i) Thin Film Capacitor Forming Step

First, as shown in FIGS. 6A to 7A, by a method approximately similar to that in Example 1, the thin film capacitors 115 are formed on the support substrate 111. The support substrate 111 is, for example, a silicon wafer having Si thermal oxide layer.

(ii) Silicon Etching Step

Figure 7A:
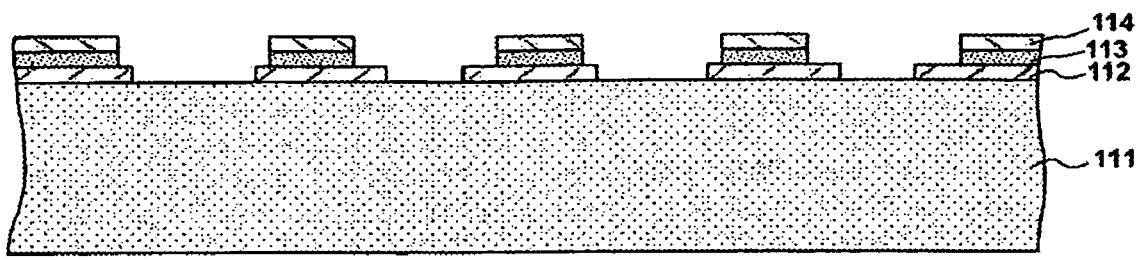
FIGS. 7A to 7C are schematic cross-sectional views (part 2) of one example of a method for manufacturing an interposer of Example 6 according to the present invention.
Figure 7B:
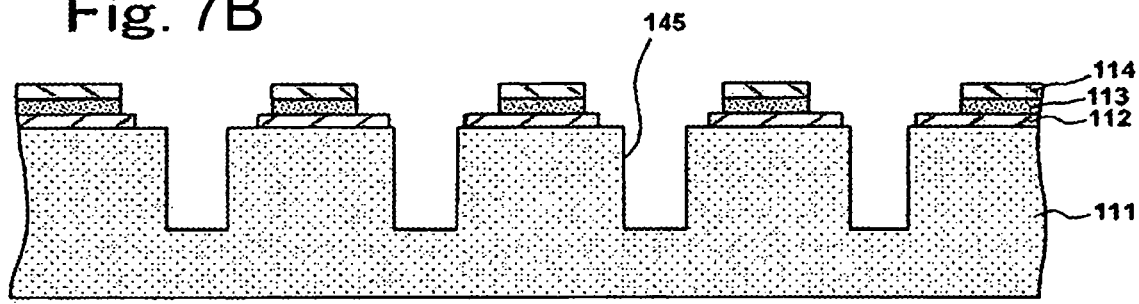

Next, as shown in FIG. 7B, holes 145 for through vias are formed. In particular, by inductively coupled plasma (ICP) etching, the holes 145 having a large aspect ratio are formed in the silicon wafer (support substrate 111). In this step, the number of the holes formed by etching is determined in accordance with number of bump connections of a semiconductor device 100 on which the interposer 110 is mounted; however, in general, the number of the holes is the same as that of the through vias 135 provided in the interposer 110.

In this step, for example, since the diameter of a solder bump 121 is 80 μm, deep etching is performed to form a hole having a diameter of 100 μm and a depth of 150 μm.

(iii) Through Via Filling Step

Next, as shown in FIGS. 7C to 8A, major parts of the through via hole 135 are formed.

Figure 7C:
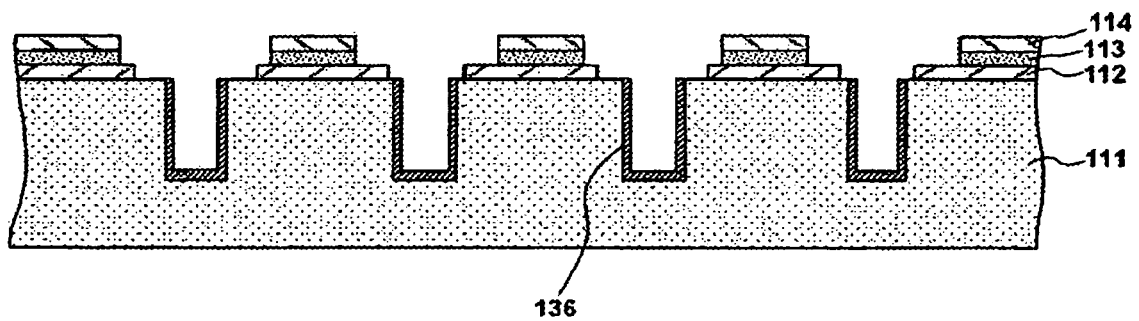

First, by a chemical vapor deposition (CVD) method, a silicon oxide (SiO$_2$) film having a predetermined thickness is formed. Next, by etching, parts of the silicon oxide film at positions other than those at which the through vias 135 are to be formed are removed. By the steps described above, insulating portions 136 are formed inside the holes 145, so that the insides of the holes 145 are insulated (FIG. 7C).

Figure 8A:
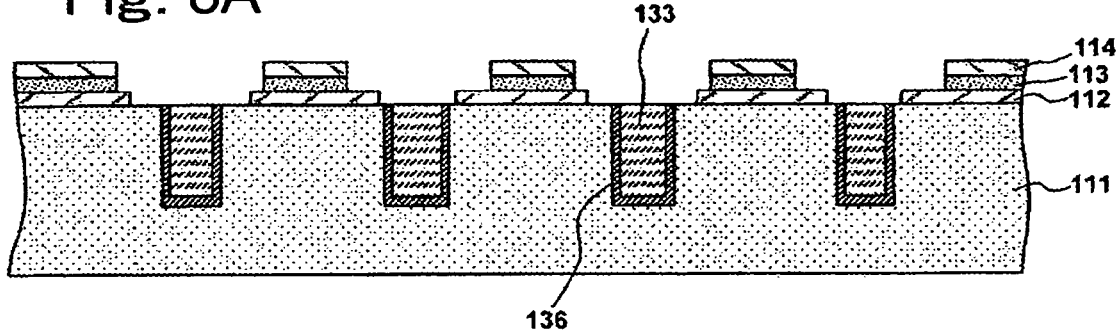
FIGS. 8A to 8C are schematic cross-sectional views (part 3) of one example of a method for manufacturing an interposer of Example 6 according to the present invention.

Subsequently, chromium (Cr) and copper (Cu) are sputtered, so that a seed layer (not shown) is formed. Next, by electrical plating, the insides of the holes 145 are filled with copper, so that conductive portions 133 are formed (FIG. 8A).

(iv) Moisture-Resistant Protective Film Forming Step

Figure 8B:
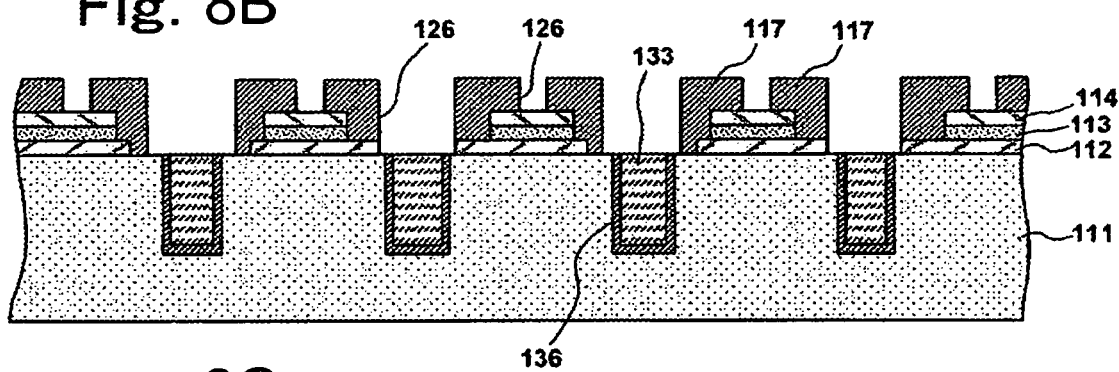

Next, as shown in FIG. 8B, a moisture-resistant protective film 117 is formed. In particular, an alumina (Al$_2$O$_3$) film having a thickness of 100 nm is formed by a sputtering method, followed by selective patterning of the alumina film thus formed by dry etching, so that unnecessary parts are removed. By the process described above, the moisture-resistant protective film 117 is formed so that part of the upper electrode 114 and part of the lower electrode 112 of each of the thin film capacitors 115 are exposed.

(v) Resistor Layer Forming Step

Figure 8C:
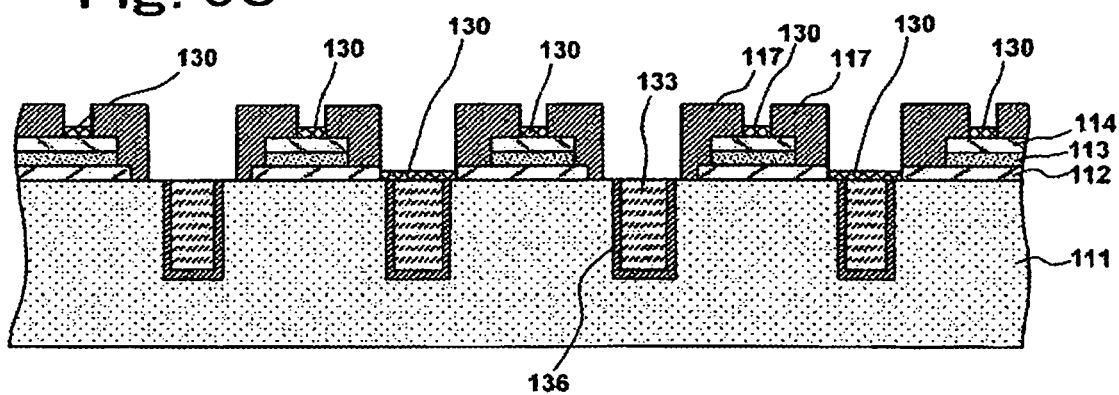

Next, as shown in FIG. 8C, the resistor layers 130 are formed. In particular, first, by a sputtering method, an alloy thin film of Ni—Cr—Si having a thickness of 20 nm is formed. The sputtering is performed, for example, at a substrate temperature of 60° C., an RF power of 1 kW, and a gas pressure of 1 Pa.

Subsequently, by an ion milling method, selective patterning of the alloy thin film thus formed is performed. That is, all unnecessary portions other than those in the opening portions formed in the alumina are removed. By the process described above, the resistor layers 130 are formed.

(vi) Protective Film Forming Step

Figure 9A:
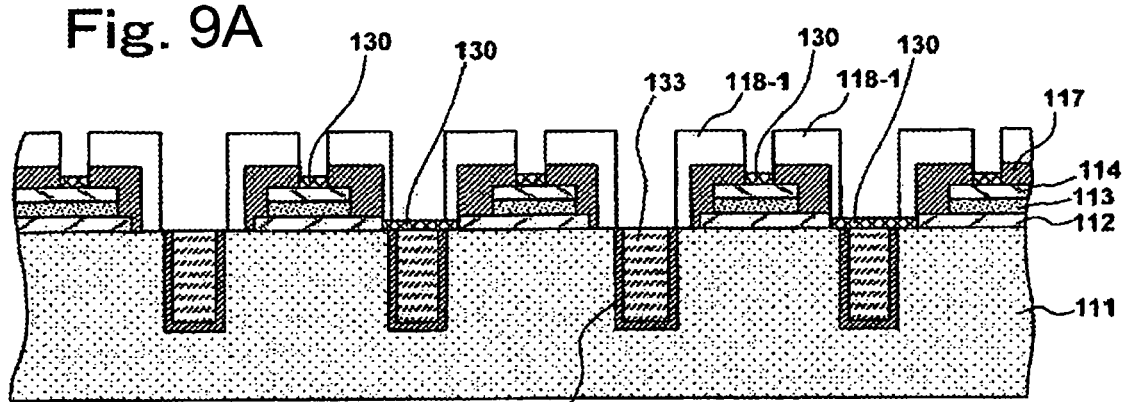
FIGS. 9A to 9C are schematic cross-sectional views (part 4) of one example of a method for manufacturing an interposer of Example 6 according to the present invention.

Next, as shown in FIG. 9A, a protective film (118-1) made of an organic resin is formed. In particular, aminopropyltriethoxysilane NH$_2$(CH$_2$)$_3$Si(OC$_2$H$_5$)$_3$ is spin-coated at 1,500 rpm for 30 seconds, followed by heating at 90° C. by a hot plate. Then, after a photosensitive polyimide resin is applied, exposure/development treatment and heating at, 400° C. (baking treatment) are sequentially performed.

By the process described above, as the protective film, a photosensitive polyimide resin film having a thickness of 3 μm is formed. As described above, in this example, before the organic resin (photosensitive polyimide resin) film is formed as the protective film, as an adhesive, a silane coupling agent is applied.

(vii) Lead Wire Forming Step

Figure 9B:
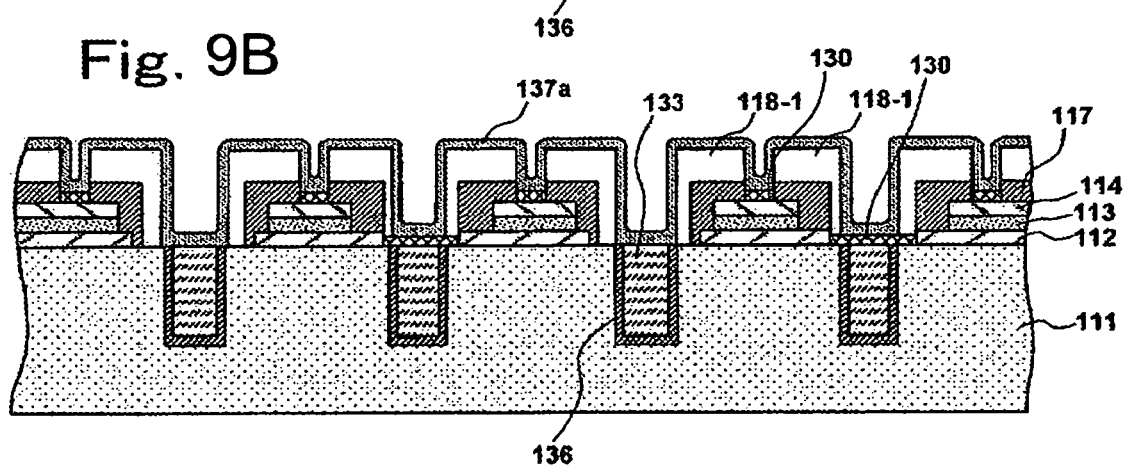
Figure 9C:
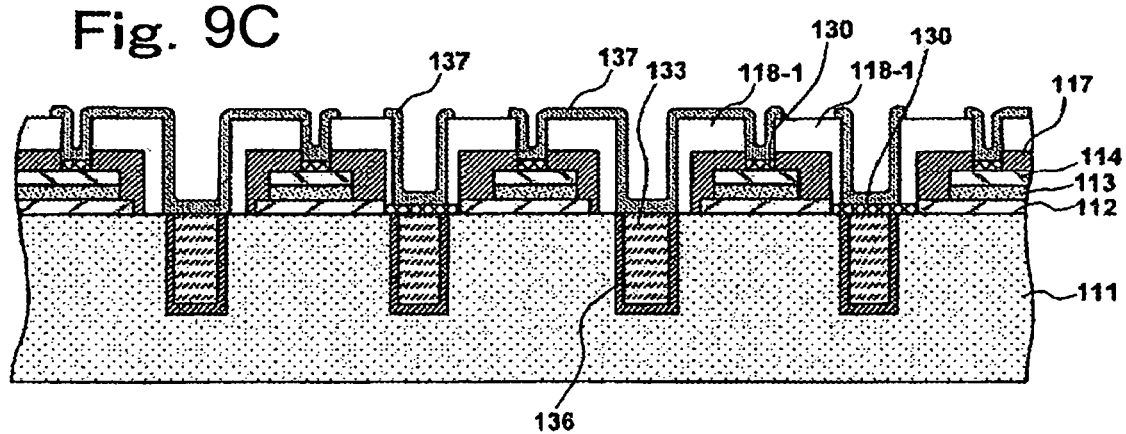

Next, as shown in FIGS. 9B and 9C, a copper wiring layer is formed by a copper (Cu) semi-additive method, and unnecessary parts are then removed, so that the lead wires 137 are formed. The lead wires 137 electrically connect the through vias 135 to the respective electrodes of the thin film capacitors 115.

(viii) Back-side Surface Polishing and Terminal Forming Step

Figure 10A:
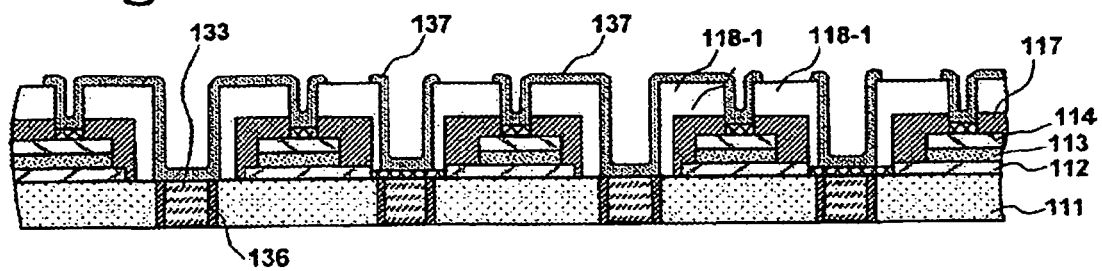
FIGS. 10A to 10C are schematic cross-sectional views (part 5) of one example of a method for manufacturing an interposer of Example 6 according to the present invention.

Next, as shown in FIG. 10A, by a known polishing method, the back-side surface of the support substrate (silicon wafer) 111 is polished, so that the conductive portions 133 for the through vias 135 are exposed. In this example, in the polishing step, the thickness of the support substrate (silicon wafer) 111 is decreased to 100 μm by polishing.

Figure 10B:
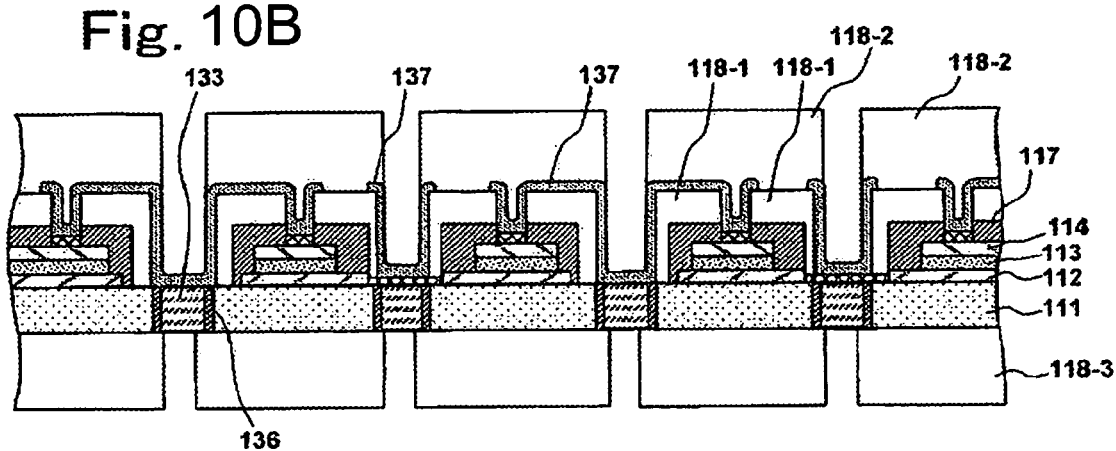

Next, as shown in FIG. 10B, on the first primary surface 138 and the second primary surface 139, an organic resin film 118-2 and an organic resin film 118-3 are formed, respectively.

Figure 10C:
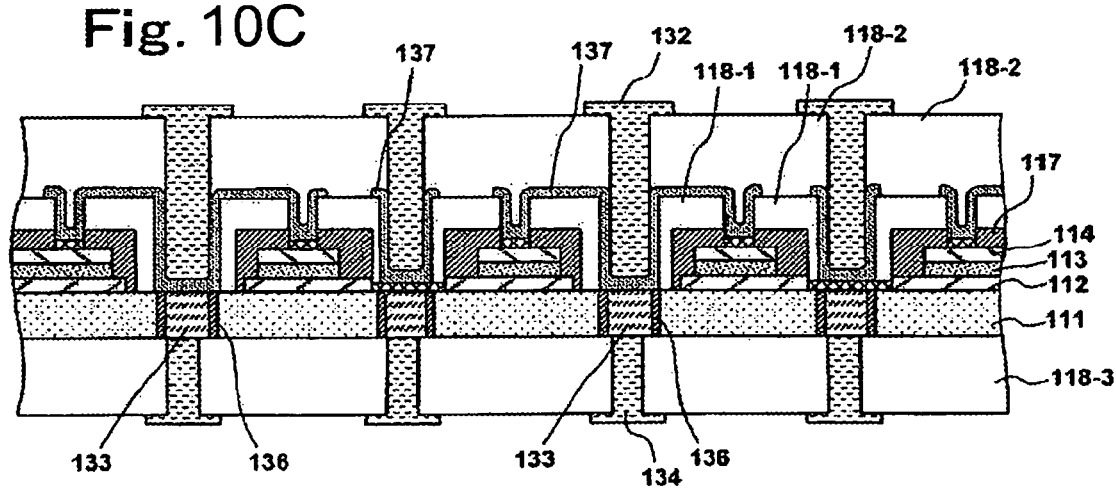

Next, as shown in FIG. 10C, in the organic resin film 118-2 and the organic resin film 118-3, conductive portions 132 and the conductive portions 134 are formed, respectively, for forming the through vias 135. In this case, the conductive portions preferably have properties similar to those of the UBM described above.

By the steps described above, the interposer 110 embedding thin film capacitors is formed.

Example 7

Figure 11:
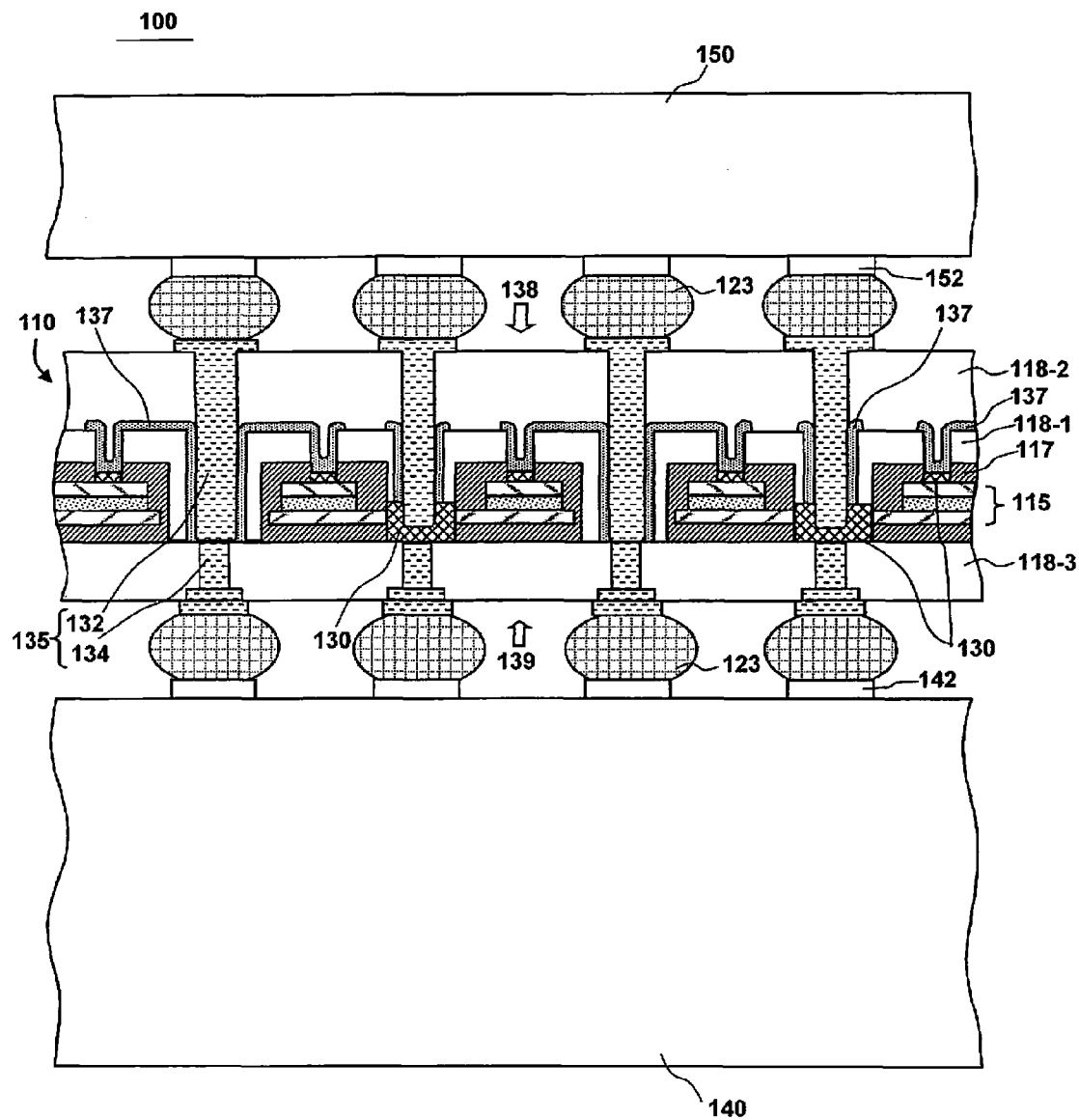
FIG. 11 is a schematic cross-sectional view of one example of an interposer of Example 7 according to the present invention.

This example is a modified example of Example 6, and a film-based thin film interposer will be described which does not use a silicon substrate. FIG. 11 is a schematic cross-sectional view of one example of a film-based interposer of Example 7 according to the present invention.

A particular structure of this example is shown in FIG. 11, and in addition, the manufacturing method thereof will also be described with reference to FIGS. 6A to 10C as is the case of Example 6 described above.

As shown in FIG. 11, in this example, the support substrate 111 made of silicon in Example 6 (FIG. 5) is not provided. Hereinafter, the manufacturing method thereof will be described.

First, in this example, before starting the thin film capacitor forming step (i) of Example 6, the following preliminary process (protective film forming process) is performed.

First, on a silicon wafer 160 used as the support substrate, a protective film (not shown) for protecting the thin film capacitors 115 is formed. That is, in this example, between the support substrate 111 and the thin film capacitors 115, the protective film (not shown) for protecting the thin film capacitors 115 is formed. Although the silicon wafer 160 corresponds to the support substrate 111 shown in FIG. 6A, in this example, the silicon wafer 160 is removed at the final stage.

When the silicon wafer used as the support substrate 111 is removed, the protective film described above covers the lower electrode side of the thin film capacitors 115, that is, the second primary surface 139 side, and hence the protective film functions so as not to expose the thin film capacitors 115 to the outside atmosphere. Accordingly, the protective film described above is preferably formed of the same material as that for the protective film 119 of Example 6.

In particular, first, on the silicon wafer, an adhesive layer is formed in order to adhere between the silicon wafer and the protective film. The adhesive layer is formed of titanium (Ti) and copper (Cu), and the layers thereof are formed by sputtering.

Next, on the adhesive layer, a polyimide resin layer is formed as the protective film. As a commercial available polyimide resin, a varnish is generally sold which contains a solvent and a polyimide resin dissolved therein, and the heat resistant temperature thereof is 300 to 400° C.

This polyimide varnish is heated to 90° C. (pre-baking) by a hot plate so as to be semi-cured (pre-cured). Next, the temperature is increased to 400° C. (post-baking) so as to fully cure the polyimide resin varnish in the semi-cured state, thereby forming a polyimide resin layer having a thickness of 5 μm. A material for this polyimide resin layer is the same as that for the organic resin film 118 described above.

Next, as is the "moisture-resistant protective film forming step (iii)" in Example 1, a moisture-resistant protective film (not shown) is formed at the second primary surface 139 side of the thin film capacitor 115 by sputtering.

In this step, the sputtering is performed, for example, at a substrate temperature of 80° C., an RF power of 500 W, a gas pressure of 0.1 Pa, and an $Ar/O_2$ ratio of 10/1.

The steps described above are for the preliminary process. Then, as described below, the thin film capacitors are formed.

(i) Thin Film Capacitor Forming Step

Next, as shown in FIGS. 6A to 7A, on the silicon wafer as the support substrate 111, the thin film capacitors 115 are formed.

First, as is the case of Example 6, by a sputtering method, the lower electrodes 112 of the thin film capacitors 115 are formed. In this step, the thickness of the lower electrode 112 made of platinum (Pt) is set to 200 nm.

Next, as is the case of Example 6, by a sputtering method, the dielectric layers 113 of the thin film capacitors 115 are formed. In this example, as a capacitor dielectric material, $SrTiO_3$ (hereinafter referred to as "STO") is used.

The sputtering is performed at a substrate temperature of 200° C., an RF power of 800 W, a gas pressure of 0.3 Pa, and an $Ar/O_2$ ratio of 6/1. Under the condition described above, the film formation is performed for 20 minutes, and for example, an STO film is formed having a thickness of 100 nm, a relative dielectric constant of 300, and a dielectric loss of 1% or less.

Next, by a photolithographic method, a resist mask (not shown) is formed, and the STO film is then dry-etched by an ion milling method.

Subsequently, by a method similar to that for forming the lower electrodes 112, upper electrodes having a thickness of 200 nm are formed.

Next, a "silicon etching step (ii)", a "through via filling step (iii)", and a "moisture-resistant protective film forming step (iv)" are performed in a manner similar to that of the forming steps (ii) to (iv) of Example 6.

(v) Resistor Layer Forming Step

Next, as shown in FIG. 8C, the resistor layers 130 are formed. In particular, first, a Ni—Cr alloy thin film having a thickness of 30 nm is formed by a sputtering method. The sputtering is performed at a substrate temperature of 60° C., an RF power of 1 kW, and a gas pressure of 1 Pa.

Subsequently, by an ion milling method, selective patterning of the alloy thin film thus formed is performed. That is, unnecessary parts of the alloy thin film other than those located only in the opening portions (opening portions 126) formed in the alumina are removed. By the process as described above, the resistor layers 130 are formed.

(vi) Protective Film Forming Step

Next, by a method similar to that in Example 6, a photosensitive polyimide resin film having a thickness of 4 μm is formed.

Subsequently, in a manner similar to that in Example 6, a "lead wire forming step (vii)" and a "back-side surface polishing and terminal forming step (viii)" are performed.

By the steps described above, the interposer 110 is formed which is provided with the silicon wafer 160 remaining as the support substrate.

(ix) Silicon Removing Step

Next, from the interposer 110 formed through the steps described above, the silicon wafer 160 used as the support substrate is removed. This removing step is shown in FIGS. 12A to 13B.

Figure 12A:
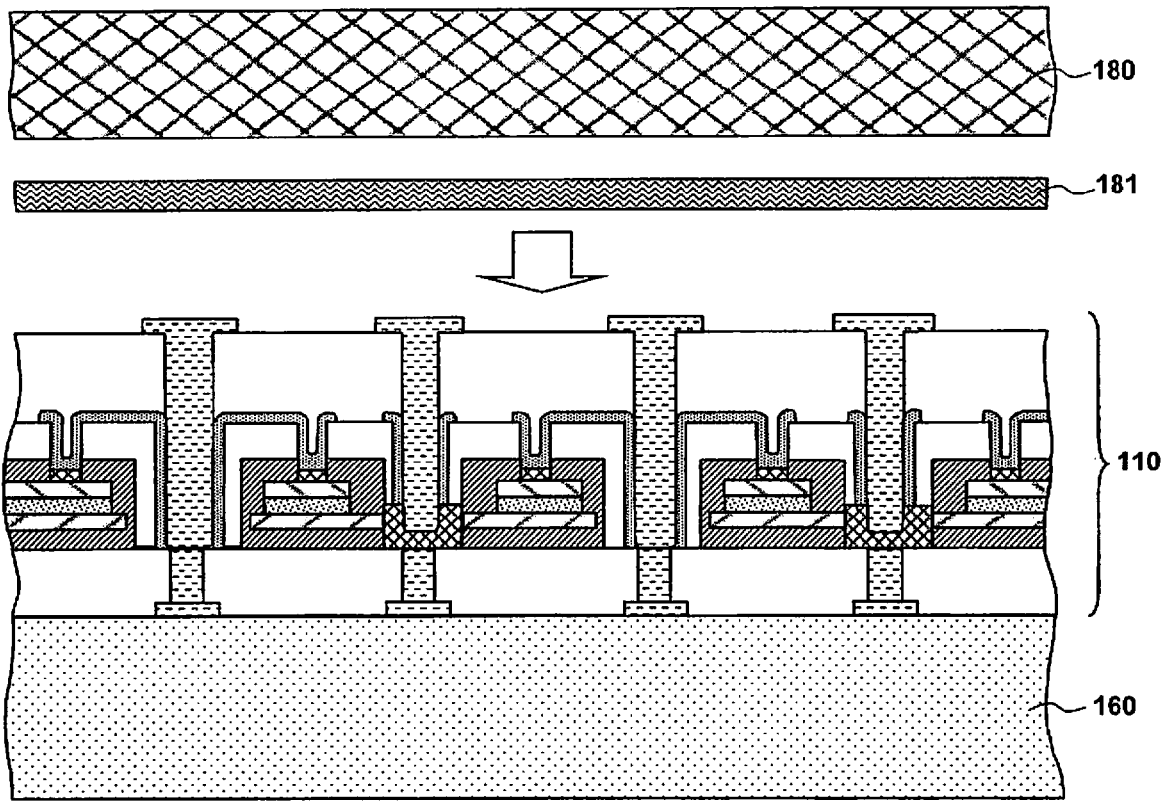
FIGS. 12A and 12B are schematic cross-sectional views (part 1) of one example of a process for removing a silicon wafer of Example 7 according to the present invention.
Figure 12B:
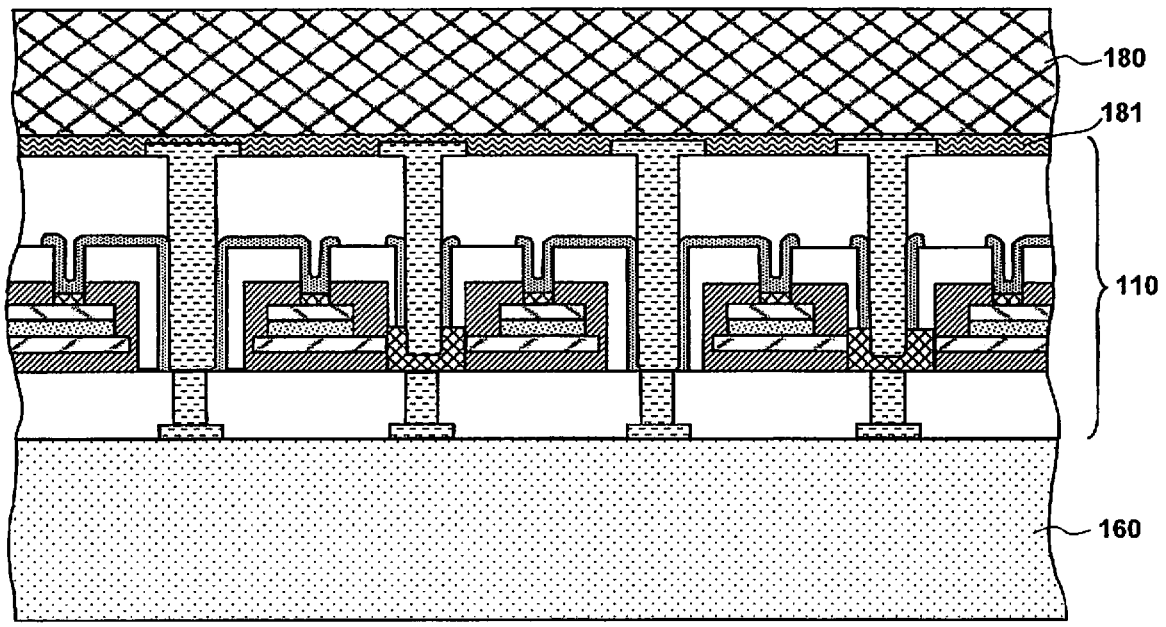

First, as shown in FIGS. 12A and 12B, by using a heat-foaming type tape 181, the thin film interposer 110 formed through the steps described above is adhered onto a glass plate 180 used as a support stage.

Figure 13A:
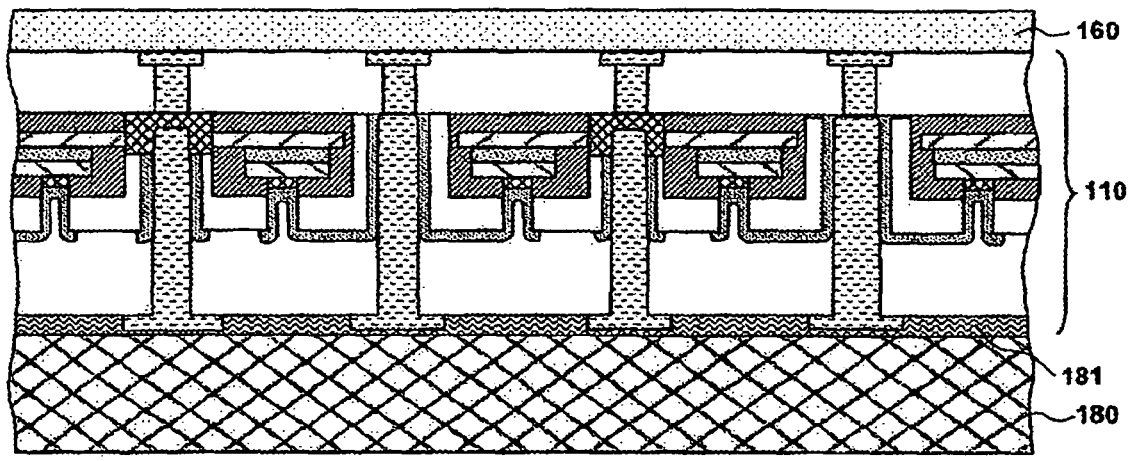
FIGS. 13A and 13B are schematic cross-sectional views (part 2) of one example of a process for removing a silicon wafer of Example 7 according to the present invention.

Next, as shown in FIG. 13A, the silicon wafer 160 is grinded from the surface opposite to that provided with the glass plate 180. In this step, the thickness of the silicon wafer 160 is decreased to approximately 100 μm by grinding.

Figure 13B:
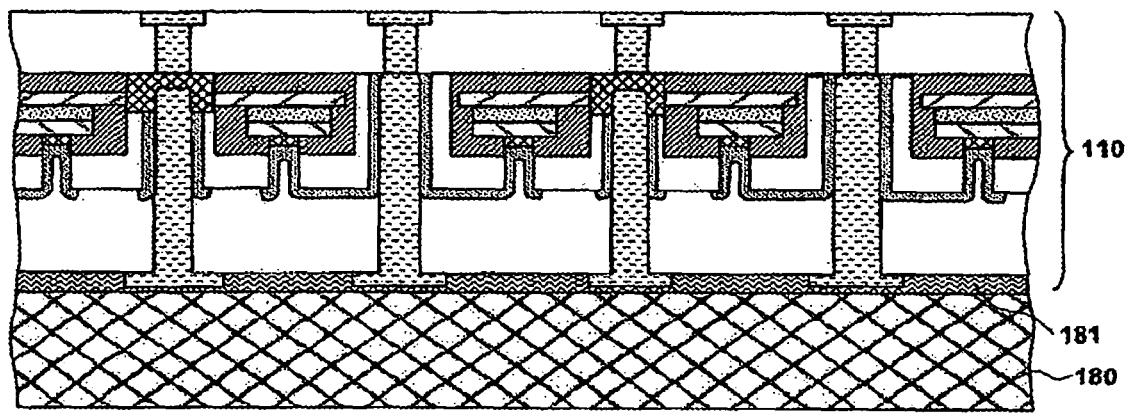

Next, as shown in FIG. 13B, by a chemical etching using a hydrofluoric acid (an aqueous HF solution), the silicon wafer 160 is perfectly removed.

By the steps described above, the interposer 110 (thin film interposer) in the form of a film is formed. For convenience in handling, this interposer is provided with the glass plate until it is mounted on a circuit board or the like.

Next, a process for manufacturing a semiconductor package mounting the interposer 110 of Example 7 will be described with reference to figures. FIGS. 14A to 15B are schematic cross-sectional views showing one example of a manufacturing process of a semiconductor package of Example 8 according to the present invention.

Figure 14A:
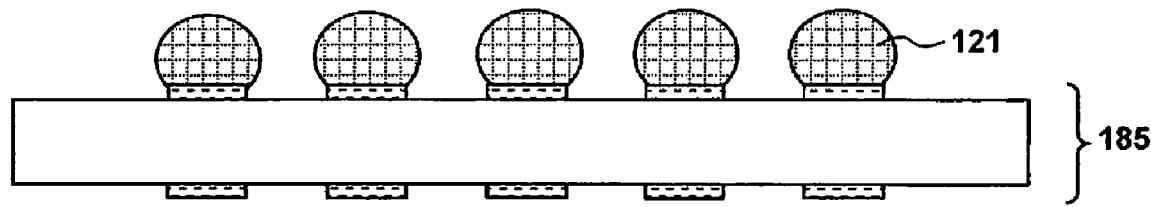
FIGS. 14A to 14C are schematic cross-sectional views (part 1) of one example of a process for manufacturing a semiconductor package of Example 8 according to the present invention.
Figure 14B:
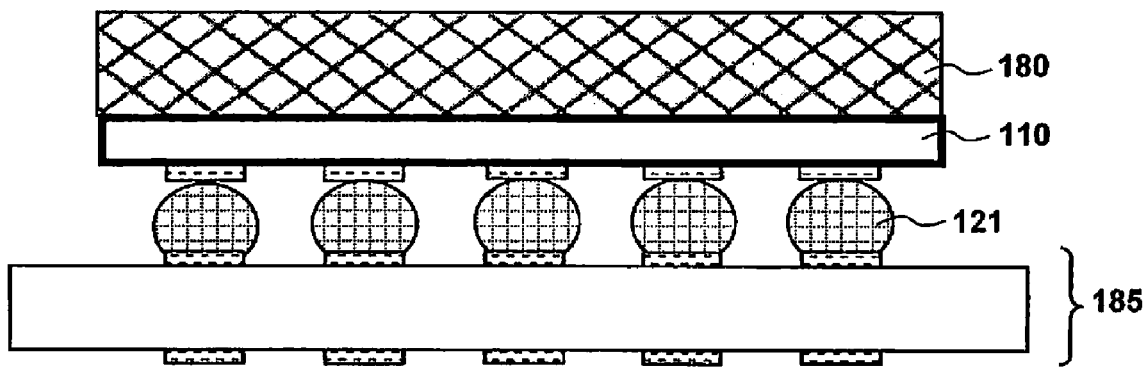

First, as shown in FIGS. 14A and 14B, the film-shaped interposer 110 is mounted on a package substrate 185 having the bumps 121 formed, for example, of a solder. In this step, the interposer 110 is still adhered to the glass substrate 180.

Example 8

Next, a solder reflow process is performed, so that the interposer 110 is bonded to the package substrate 185. In this step, a tape material (not shown) adhering the interposer 110 to the glass plate 185 is foamed by heating, and as a result, as shown in FIG. 14C, the glass plate 180 is separated from the interposer 110.

Figure 14C:
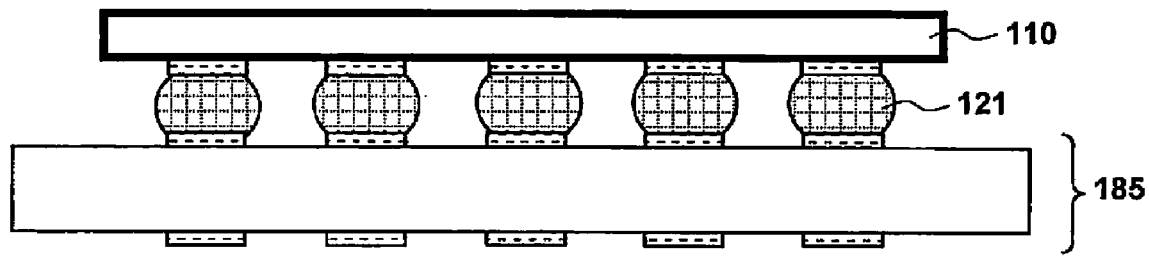
Figure 15A:
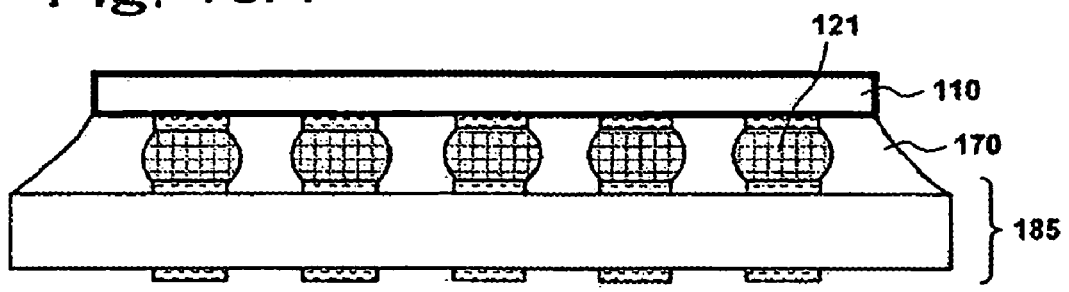
FIGS. 15A and 15B are schematic cross-sectional views (part 2) of one example of a process for manufacturing a semiconductor package of Example 8 according to the present invention.
Figure 15B:
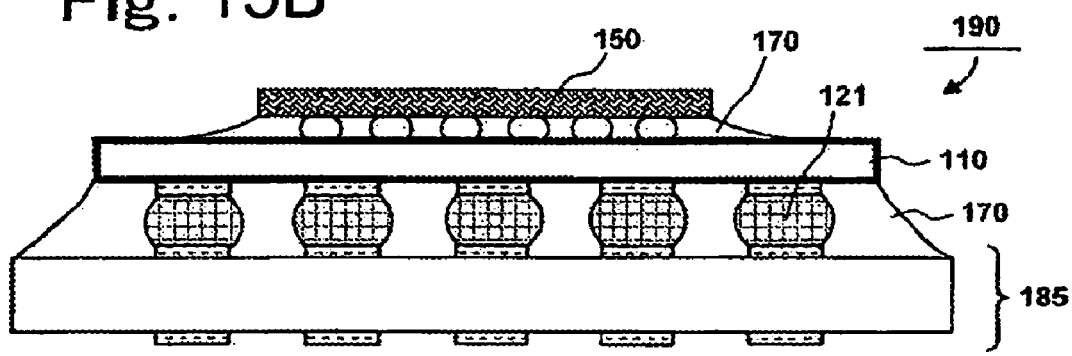

Subsequently, an underfill material 170 is filled into the package substrate 185 in the state as shown in FIG. 14C, so that the interposer 110 is tightly fixed to the package substrate 185 (FIG. 15A). Then, the semiconductor integrated circuit 150 is mounted on the interposer 110, and as a result, a semiconductor package 190 using the film-shaped thin film interposer is formed (FIG. 15B).

What is claimed is:

1. An interposer, comprising:
a substrate having a first via and a second via penetrating through the substrate;
a thin film capacitor provided on one-side of a surface of the substrate, the thin film capacitor having a lower electrode, a dielectric layer, and an upper electrode formed in the order of recitation;
an insulating film over the thin film capacitor and the one-side of the surface of the substrate;
a hole formed in the insulating film, the hole being from a surface of the insulating film to the upper electrode;
a first resistor layer which is provided on the upper electrode in the hole, the first resistor layer having a higher resistivity than that of the upper electrode a second resistor layer is adjacent to the lower electrode on one-side of a surface of the second via, the second resistor layer having a higher resistivity than that of the adjacent lower electrode, the second resister being connected to the adjacent lower electrode;
a first external terminal being electrically connected to the first resister and the first via;
a second external terminal being connected to the second resistor; and
a third external terminal being connected to another-side of a surface of the second via in accordance with the another-side of a surface of the substrate.

2. A semiconductor device having a semiconductor chip, a circuit substrate, and an interposer electrically connecting between the semiconductor chip and the circuit substrate, comprising:
wherein the interposer comprises:
a substrate having a first via and a second via penetrating through the substrate;
a thin film capacitor provided on one-side of a surface of the substrate, the thin film capacitor having a lower electrode, a dielectric layer, and an upper electrode formed in the order of recitation;
an insulating film over the thin film capacitor and the one-side of the surface of the substrate;
a hole formed in the insulating film, the hole being from a surface of the insulating film to the upper electrode;
a first resistor layer which is provided on the upper electrode in the hole, the first resistor layer having a higher resistivity than that of the upper electrode;
a second resistor layer is adjacent to the lower electrode on one-side of a surface of the second via, the second resistor layer having a higher resistivity than that of the adjacent lower electrode, the second resister being connected to the adjacent lower electrode;
a first external terminal being electrically connected to the first resister and the first via;
a second external terminal being connected to the second resistor; and
a third external terminal being connected to another-side of a surface of the second via in accordance with the another-side of a surface of the substrate.

3. The semiconductor device according to claim 2, wherein the insulating film includes a first protective film having moisture-resistance covering the thin film capacitor, and
a second protective film comprising organic resin covering the first protective film.

4. The semiconductor device according to claim 2, wherein the resistor layer comprises a transition metal nitride or a transition metal oxide.

5. The semiconductor device according to claim 2, wherein the resistor layer comprises an alloy containing at least two elements selected from the group consisting of Ni, Cr, Al, Si, and Fe.

6. The semiconductor device according to claim 2, wherein the resistor layer comprises a material having a resistivity of 100 Ωcm or more.

7. The semiconductor device according to claim 3, wherein first protective film having moisture-resistance and the dielectric layer are formed of amorphous metal oxides, and first protective film and the dielectric layer are formed from the same elements.

8. The interposer according to claim 1, wherein the thin film capacitor is between the first external terminal and the second external terminal.

* * * * *